United States Patent [19]
Kordina et al.

[11] Patent Number: 5,674,320
[45] Date of Patent: Oct. 7, 1997

[54] SUSCEPTOR FOR A DEVICE FOR EPITAXIALLY GROWING OBJECTS AND SUCH A DEVICE

[75] Inventors: Olle Kordina, Sturefors; Jan-Olov Fornell, Malmö; Rune Berge; Roger Nilsson, both of Lund, all of Sweden

[73] Assignee: ABB Research Ltd., Zurich, Switzerland

[21] Appl. No.: 616,646

[22] Filed: Mar. 15, 1996

[51] Int. Cl.$^6$ .................................................. C23C 16/00
[52] U.S. Cl. ........................ 118/500; 118/715; 118/728
[58] Field of Search ........................... 118/715, 728, 118/500

[56] References Cited

U.S. PATENT DOCUMENTS

| | | | |
|---|---|---|---|
| 3,098,763 | 7/1963 | Deal | 118/725 |
| 4,339,645 | 7/1982 | Miller | 118/725 |
| 4,421,786 | 12/1983 | Mahajan | 118/725 |
| 5,119,540 | 6/1992 | Kong | 118/730 |

FOREIGN PATENT DOCUMENTS

| | | |
|---|---|---|
| 0 164 928 | of 1985 | European Pat. Off. |
| 0 269 439 | of 1988 | European Pat. Off. |
| 0 519 608 | of 1992 | European Pat. Off. |

OTHER PUBLICATIONS

Kordina, Growth And Characterisation of Silicon Carbide Power Device Material, Paper I, pp. 47–59, Linkoping Studies in Science and Technology, Dissertations No. 352, Department of Physics and Measurement Technology, Linkoping University, Sweden, 1994.

Primary Examiner—Richard Bueker
Attorney, Agent, or Firm—Pollock, Vande Sande & Priddy

[57] ABSTRACT

A susceptor for a device for epitaxially growing objects of a material on a substrate. The material is selected from the group consisting of SiC, a Group 3B-nitride, and alloys of SiC and a Group 3B-nitride. The susceptor includes at least two channels each adapted to receive at least one substrate for growth of at least one of the objects and each adapted to receive a flow of the material to be fed to the susceptor for the growth of the objects. Walls surround the at least two channels including a central part between the channels. Heat is applied surrounding the susceptor, including the walls and the central part. A higher electrical resistance for induction currents generated by the heating is provided over at least one cross-sectional area of the susceptor. The higher electrical resistance is created by a physical division of the susceptor walls and a thin plate of SiC. The higher electrical resistance extends between the channels of the susceptor and an outer limitation of the susceptor and between separate wall parts of the susceptor.

24 Claims, 4 Drawing Sheets

SUSCEPTOR FOR A DEVICE FOR EPITAXIALLY GROWING OBJECTS AND SUCH A DEVICE

TECHNICAL FIELD OF THE INVENTION

The present invention relates to a susceptor for a device for epitaxially growing objects of one of a) SiC, b) a Group 3B-nitride and c) alloys thereof on a substrate to be received in the susceptor. The susceptor has a channel adapted to receive the substrate and through which a source material for the growth is intended to be fed. The walls of the susceptor surrounding the channel are intended to be heated by heating means intended to surround the susceptor. The present invention also relates to a device for epitaxially growing such objects.

Accordingly, the invention is applicable to the growth of SiC, Group 3B-nitrides and all types of alloys thereof. However, the common problem of growing such crystals of a high quality will now by way of a non-limitative example be further explained for SiC.

BACKGROUND OF THE INVENTION

High temperatures are needed for obtaining a good ordered growth of SiC-crystals. Different growth techniques are conceivable and are within the scope of the present invention, however Chemical Vapour Deposition (CVD) is the most used one for growing epitaxial layers of SiC for, in particular, power device applications. Therefore, this technique will hereinafter be discussed for illuminating the problem to be solved by the invention.

In the Chemical Vapour Deposition, source material for the growth is present in form of precursor gases, normally silane and propane. Heating to temperatures in excess of 1 400° C. is needed both to obtain decomposition by cracking of these Si- and C-containing precursor gases and to ensure that the atoms are deposited on the substrate surface in an ordered manner. High temperatures also cause problems with impurities coming out of different types of material. Therefore the selection of a suitable material withstanding the high temperature is crucial in order to prevent unwanted impurities from being incorporated in the layers of the SiC crystal grown.

To prevent this problem it is common practice to coat the susceptor walls, which normally are made of graphite, with a SiC layer. Furthermore, a susceptor of the type described in the introduction is a hot-wall type susceptor. In a hot-wall-type susceptor, the walls surrounding a channel receiving the substrate are heated. Through such heating a substantially uniform temperature may be achieved in the susceptor. As a result, only small temperature gradients exist, which is favourable to the quality of the crystal grown on the substrate. Also, at these temperatures a difference in temperature on the order of 15-20 K between different wall parts surrounding the channel in such a susceptor will result in a remarkable difference of the crystalline quality of the object grown with respect to the case of temperature uniformity.

A susceptor of this type also provides a higher temperature in the gas phase than that of a cold-wall susceptor. The higher temperature increases the cracking efficiency and all the chemical reactions. This may cause a problem with depletion of the precursor gases. However, due to the geometry and the expansion of the gas when it is heated the velocity is very high. This will improve the uniformity of the grown layers. It is also known, as discussed in Swedish patent application No. 9500326-5 of the applicant, to place a plate of SiC in the susceptor between the susceptor and the substrate. The plate of SiC solves the problem of the etching or subliming of the SiC coating underneath the substrate and deposition on the backside of the somewhat colder substrate, which will limit the lifetime of the susceptor.

A hot-wall type susceptor as described in the above referenced Swedish patent application ensures the growth of epitaxial layers of SiC with a very high crystalline quality to very high thicknesses with low impurity incorporation and long carrier lifetimes. However, although the growth rate so obtained is comparatively high, the growth methods obtainable by using such a susceptor may be considered not capable of producing the objects in question at a rate and to a cost making them commercially competitive.

SUMMARY OF THE INVENTION

The object of the present invention is to solve the problem mentioned above by providing a susceptor and a device of the type defined in the introduction, which make it possible to grow the objects in question in a commercially competitive way.

This object is in accordance with the present invention which may be obtained by providing the susceptor defined above with at least two channels adapted to receive at least one substrate for the growth of at least one object each and to receive a portion each of a flow of the source material to be fed to the susceptor for the growth as well as a device as described below.

Such a susceptor makes it possible to scale up the process and by the use of one single susceptor grow, at least two objects in the same growth run by simultaneously growing one object in each channel of the susceptor. In this way it will, for instance, only be necessary to have one reactor with peripheral equipment for the growth of a certain number of objects in a certain unit of time. On the other hand the prior art susceptors would require two or more reactors for obtaining the same result. Thus, the inventional idea of scaling up the process by providing one susceptor with at least two channels for growing such objects in each channel will result in a considerable saving of resources and remarkably improve the possibility of producing the objects to a cost making them commercially interesting.

According to a preferred embodiment of the invention the channels are adapted to receive substantially equal portions of the flow of the source material. For the quality of the objects grown by a susceptor of this type it may be essential that substantially the same conditions prevail for all the objects grown at the same time. The present invention may be obtained respect to the growth rate by this adaption of the channels of the susceptor.

According to another preferred embodiment of the invention said walls of the susceptor are designed so as to obtain a substantially uniform temperature in substantially the whole susceptor when heated by the heating means. By ensuring that a substantially uniform temperature is achieved in this way in substantially the whole susceptor it will be possible to grow objects in different channels of the susceptor with the same quality and without any detrimental influence from substantial temperature gradients.

According to another preferred embodiment of the invention the central part of the susceptor walls located between the channels has been given such a thickness that a substantially uniform temperature is obtained in substantially the whole susceptor when heated by the heating means. By choosing the thickness of the central part in dependence of the temperature behavior of the susceptor when heated it may be possible to obtain the desired substantially uniform temperature distributions.

When the susceptor is positioned so that two channels thereof are superimposed with the central part therebetween, central part may, when the heating means are adapted to heat by induction be primarily heated by, currents therethrough. The central part may also be heated by heat radiated from other parts of the susceptor, such as from the other walls not belonging to the central part surrounding the channel in question. Furthermore, the loops of induction current created by a heating means surrounding the susceptor have a tendency to run along the perimeter of the susceptor and not go through such a central part. These circumstances are to be kept in mind when designing the susceptor so as to obtain a temperature uniformity in substantially the whole susceptor.

According to a further embodiment of the invention, constituting a further development of the previous embodiment, the thickness of the central part of the susceptor wall with respect to other parts of the susceptor wall is chosen depending on the relation expected of the contribution to heating the central part of: 1) radiation heat from the other parts and 2) induction currents generated by the heating means. The larger the ratio 1)/2) the smaller is the thickness and conversely. By this type of dimensioning of the central part of the susceptor the conditions necessary for the growth of high quality objects in question may be obtained.

According to another preferred embodiment of the invention the susceptor comprises means for creating a higher electrical resistance for the induction current generated by the heating means over at least one cross-sectional area of the susceptor at least partially dividing the susceptor for substantially preventing loops of the currents from crossing the area and thereby restricting different loops to different parts of the susceptor walls. In this way, the heat profile for different parts of the susceptor may be controlled so as to obtain a substantially uniform heating of all the susceptor walls avoiding the creation of hot spots and essential temperature gradients.

According to another embodiment of the invention, the higher electrical resistance creating means are arranged to prevent the loops from going around the central parts and instead guide them therethrough. This arrangement also makes it possible to obtain an efficient heating by induction in the central part of the susceptor forming a wall for two adjacent channels.

According to another preferred embodiment of the invention the area extends completely through and divides all parts of the susceptor extending from one channel to the other adjacent to the central part by extending between a channel of the susceptor and an outer limitation thereof for preventing the loops from going through the wall parts. In this way the induction currents may be efficiently guided in the susceptor.

According to another preferred embodiment of the invention such areas are arranged to extend between all channels and an outer limitation of the susceptor so as to bring the respective loop to stay in one of central parts, one of the divided wall parts and any other separated wall part resulted from the division. This arrangement provides a good possibility to control the temperature distribution within the susceptor.

According to another preferred embodiment of the invention the higher electrical resistance creating means comprises a physical division of the susceptor walls along the areas. Such a physical division may be enough for obtaining the desired higher electrical resistance without using any material other than the rest of the susceptor walls at the areas. However, it may be advantageous to combine this physical division with a corrugation of the surfaces along the physical division. This combination may be enough for obtaining the desired electrical resistance across the areas.

According to another preferred embodiment of the invention the higher electrical resistance creating means comprises plates of SiC arranged between separate wall parts of the susceptor. In this way the induction current loops may be efficiently guided without introducing materials that will negatively influence the process. Such SiC-plates may advantageously be constituted by SiC-plates of the type and having the task of the SiC plate according to the above referenced Swedish patent application, so that at the same time they may be used to solve the problem with sublimation and etching of surfaces in the channel.

The advantages of the device according to the invention may easily be derived from the discussion above of the preferred embodiments of the inventional susceptor.

Further preferred features and advantages of the susceptor and the device according to the invention are discussed below.

BRIEF DESCRIPTION OF THE DRAWINGS

With reference to the appended drawings, below follows a specific description of preferred embodiments of the invention cited as examples. In the drawings.

DESCRIPTION OF A PRIOR ART SUSCEPTOR AND DEVICE

Figure 1:
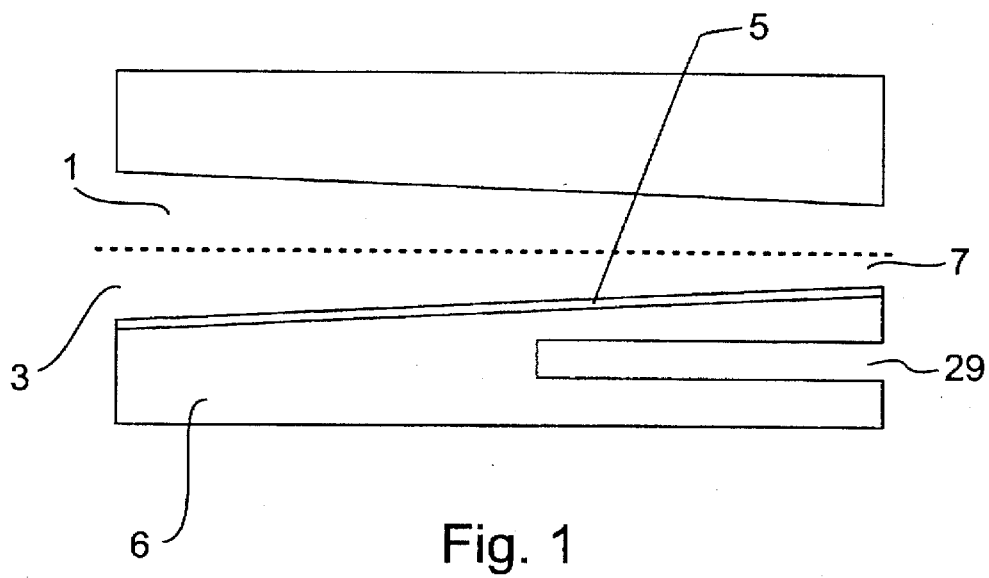
FIG. 1 is a longitudinal cross-section view of a susceptor according to the prior art.
Figure 2:
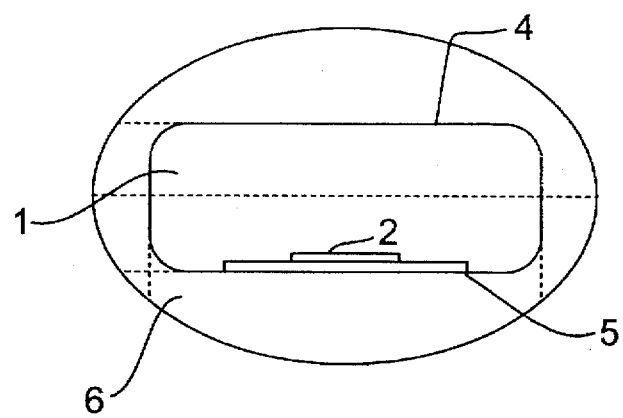
FIG. 2 is a left-side view of the susceptor according to FIG. 1.
Figure 3:
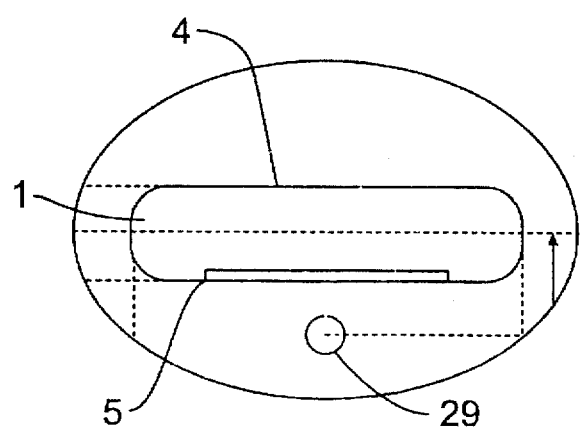
FIG. 3 is a right-side view of the susceptor according to FIG. 1.

FIGS. 1–3 show a susceptor according to the prior art and of the type described in Swedish patent application 9500326-5 of the applicant. This prior art susceptor is briefly discussed for better understanding the invention. This susceptor is a hot-wall susceptor. That is the susceptor walls surrounding a channel 1 therein are to be heated for heating a substrate 2 received in the channel as well as precursor gases introduced into the larger opening 3 of the susceptor for epitaxially growing a SiC crystal on the substrate by Chemical Vapour Deposition. "Walls" is defined as comprising lateral walls as well as the bottom and the top wall pieces surrounding the channel. The susceptor is of graphite and coated by a thin SiC coating 4. A SiC-plate 5 of high crystalline quality is applied on the bottom surface of the channel 1 between the substrate 2 and the bottom part of the wall 6 of the susceptor. The plate solves the problems of sublimation and etching of the SiC-coating 4 below the substrate 2 described in the above referenced Swedish patent application. The channel 1 tapers from the inlet opening 3 towards the outlet opening 7 for counteracting a depletion of the precursor gases. Precursor gases typically include silane and propane, and are introduced through the opening 3 for the growth of the SiC layer. The tapered channel increases the velocity of these gases slightly deeper in the channel. This means that the layer to be penetrated for deposition on the substrate will be thinner and the growth rate will increase. Such a high velocity is also favorable to the growth of uniform layers of the substrate.

A susceptor of this type is used to grow films of a thickness of 20–50 m for the use in primarily high power semiconductor devices. The gas mixture is led through the channel 1 of the susceptor. The gas mixture contains a $H_2$ carrier gas and C- and Si-containg precursor gases. Preferably these gases are in the form of propane and silane. Heating means (not shown) heat the susceptor walls 6 to heat the substrate to a temperature of 1500°–1700° C., preferably about 1550° C. The gas mixture introduced into the channel will be heated by dissipation of heat from the susceptor. The heat will result in a cracking of the percursor gases for formation of silicon and carbon-atoms, which will be deposited onto the surface of the SiC-substrate 2. In the figures it is also shown that the susceptor has a recess 29 for facilitating the handling of the susceptor during introduction into and removal out of the casing in which the growth takes place. It may also be mentioned that typical dimensions are for the channel a length of 100 mm and a width of 50 mm. The substrate typically has a length and width of about 15 mm and a thickness of 0.3 mm. Also the SiC-plate typically has a thickness of approximately 1 mm. These typical dimensions are also valid for the susceptors according to the preferred embodiments of the invention described below.

DETAILED DESCRIPTION OF PREFERRED EMBODIMENTS OF THE INVENTION

Figure 4:
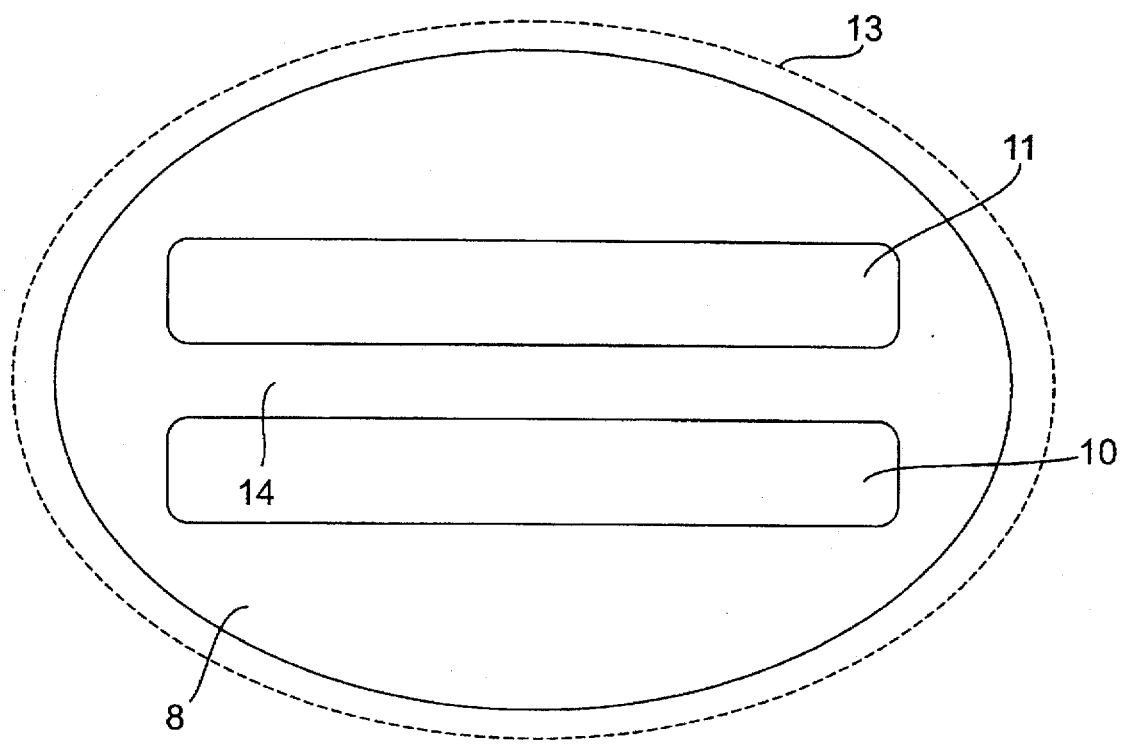
FIG. 4 is a side view corresponding to FIG. 2 of a susceptor according to a first preferred embodiment of the invention.
Figure 5:
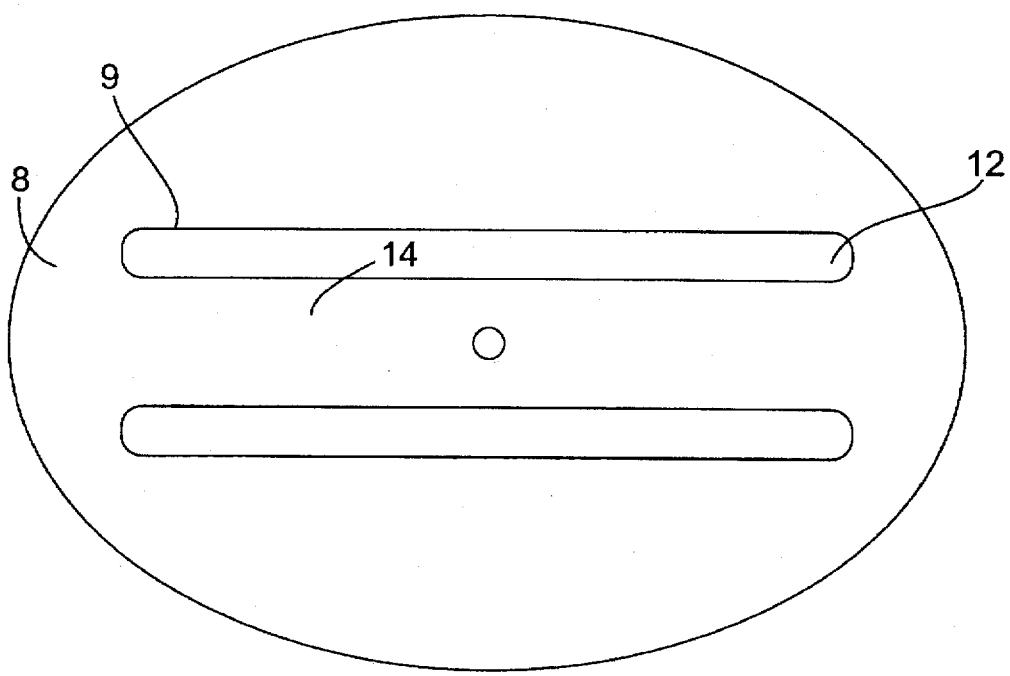
FIG. 5 is a side view of a susceptor according to FIG. 4 corresponding to the view of FIG. 3.

FIGS. 4 and 5 show schematically a susceptor according to a first preferred embodiment of the invention. This susceptor is also a so called hot-wall susceptor with walls 8 preferably made of graphite. However, the walls may also be of another material heatable by induction. The surfaces of the susceptor are covered by an SiC-coating 9.

Two slots forming two channels 10 are machined in the susceptor. These channels 10 are tapering in the same way as the prior art susceptor shown in FIG. 1 from an inlet opening 11 to an outlet opening 12. Each channel is adapted to receive a substrate for epitaxially growing a SiC-layer thereon and to receive a portion of a flow of precursor gases to be fed to the susceptor for the growth. This substrate as well as SiC plates, which may be placed between the substrate and the bottom surface of the respective channels, are, for the sake of simplicity not shown in the figures. The channels are substantially symmetrically located with respect to the center of the susceptor, so that they will receive substantially equal portions of the flow of the precursor gases.

Dashed line 13 in FIG. 4 indicates how a heating means may surround the susceptor so as to create induction currents therein. The heating means 13 is preferably a Rf-field radiating coil. The loops of induction current created by the heating means 13 have a tendency to substantially follow the perimeter of the susceptor and not enter the central part 14 of the susceptor walls located between the channels 10.

The central part 14 is, with respect to the thickness thereof, so dimensioned that a substantially uniform temperature is obtained in substantially the whole susceptor. This means that the central part is made thick if it mainly receives heat by induction currents generated therein and thin if it is heated mainly by heat radiation from other parts of the susceptor walls. The central part does, of course, also receive heat through heat conduction from adjacent hotter parts of the susceptor, if any.

By scaling up the process in this way the production capacity may be doubled with respect to the prior art susceptor according to FIGS. 1–3, since with the present invention it will be possible to simultaneously grow two crystals, one in each channel, in the same growth run. By changing the thickness of the central part in this way different heat profiles may be obtained. It will of course also be possible to arrange more than two such channels in the same susceptor for increasing the capacity further. However, the arrangement of two channels in the susceptor is very advantageous, since it is very easy to obtain substantially equal flows in both channels due to the ease of arranging them symmetrically with respect to the center of the susceptor.

Figure 6:
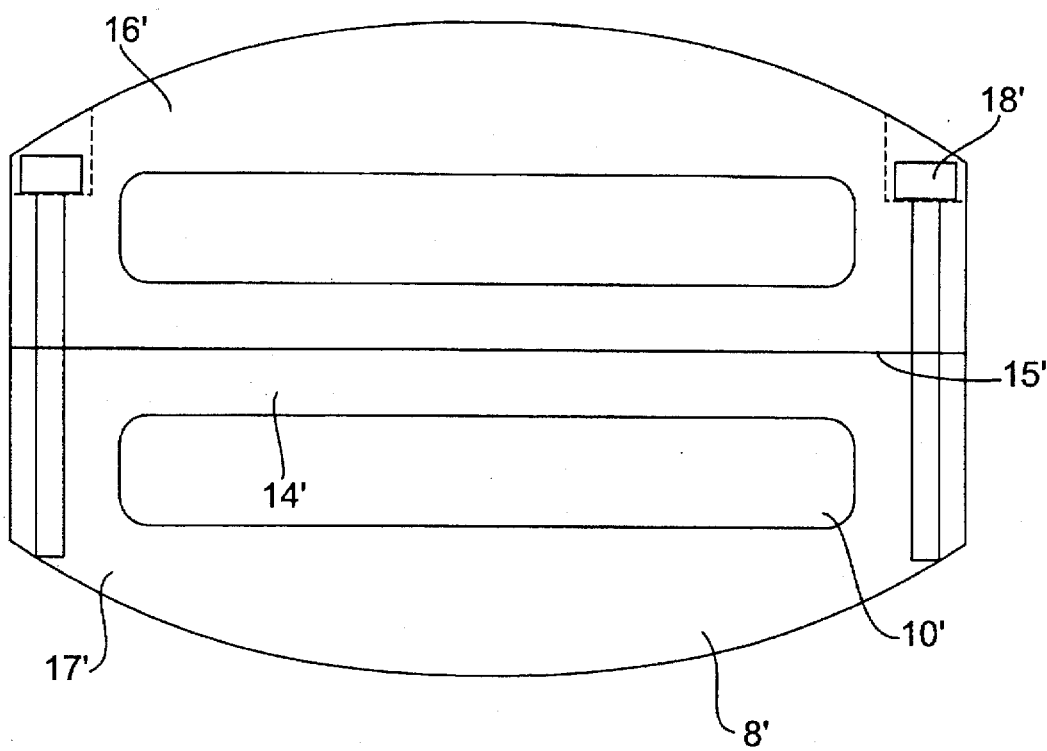
FIG. 6 is a side view of a susceptor according to a second preferred embodiment of the invention corresponding to the view of FIG. 2.
Figure 7:
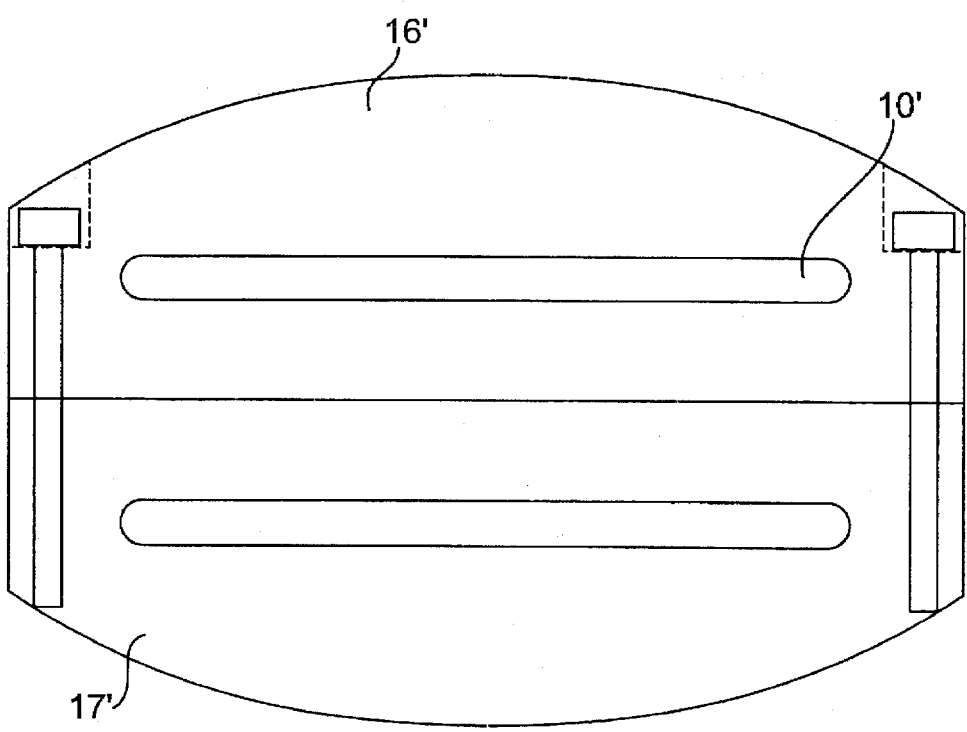
FIG. 7 is a side view of the susceptor according to FIG. 6 corresponding to the view of FIG. 3.

FIGS. 6 and 7 show a susceptor according to a second preferred embodiment of the invention. This embodiment is similar to the susceptor according to FIGS. 4 and 5 in that it has two channels 10' extending in the same way as the channels according to FIGS. 4 and 5. This susceptor has a slightly other cross-section shape than the susceptor according to FIGS. 4 and 5. However, the main difference between the susceptors is that the susceptor according to FIGS. 6 and 7 has an area 15' extending through the central part 14' of the susceptor at a distance from each of the channels 10' along which the susceptor is physically divided into substantially equal parts 16', 17'. These parts are secured to each other by securing means in the form of screws 18', preferably of graphite.

In this way the electrical resistance of the walls 8' of the susceptor is somewhat increased across the area 15'. This increase may be amplified by making the surfaces of the two parts 16', 17' applied to each other along the division area corrugated or otherwise provided with irregularities. This increase of electrical resistance will prevent the loops of currents induced by the heating means to cross the areas and go around the central part 14' along the perimeter of the susceptor and will instead guide them into the central part 14' of the susceptor. In this way be possible to obtain an increased heating of the central part 14' of the susceptor, so that it will be easier to achieve a substantially uniform temperature in substantially the whole susceptor.

Controlling the heat profiles in the susceptor by arranging the areas having a higher electrical resistance solves the problem of the creation of hot spots in the susceptor, which leads to a stronger etching of the SiC-coating there. Such hot spots are normally created in a hot-wall susceptor according to prior art where the susceptor walls are thinner than elsewhere due to an elevation of the induction current density there.

Figure 8:
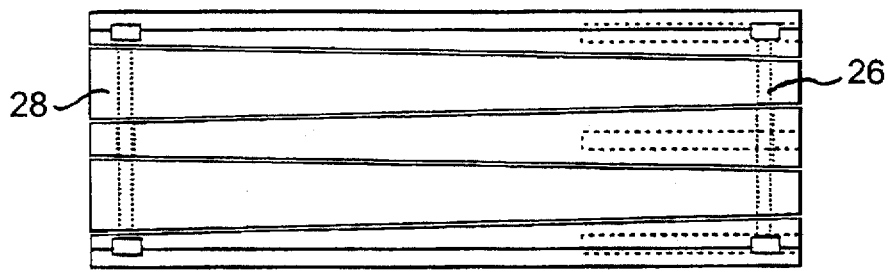
FIG. 8 is a longitudinal cross-section view of a susceptor according to a third preferred embodiment of the invention.
Figure 9:
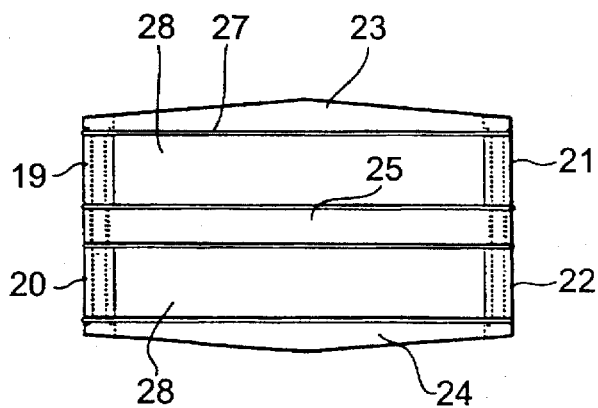
FIG. 9 is a left-side view of the susceptor according to FIG. 8.
Figure 10:
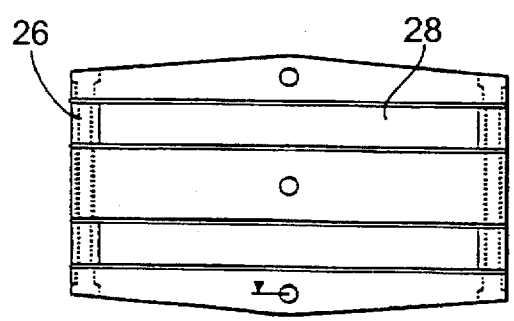
FIG. 10 is a right-side view of the susceptor according to FIG. 8.

FIGS. 8–10 schematically illustrate a susceptor according to a third preferred embodiment of the invention. This embodiment is formed by seven separate wall pieces, namely four lateral wall pieces 19, 20, 21, 22, a top wall piece 23, a bottom wall piece 24 and a central part wall piece 25. The pieces are screwed together by screws 26, preferably of graphite, extending from the top wall piece 23 to the bottom wall piece 24 through the lateral wall pieces and a respective outer region of the central part 25.

A plate 27 of SiC, an alloy of SiC and the material grown or the material grown is placed on the bottom and directly under the top or ceiling of each channel 28. The plates 27 extend through the entire susceptor for separating the different wall pieces 19–25 from each other.

This susceptor will be easy to produce. Additionally, the current loops induced by the heating means will be kept within each wall piece for heating thereof. In this way, it will be possible to divide the walls of the susceptor into different pieces for obtaining a substantially uniform temperature in the whole susceptor.

The invention is of course not in any way restricted to the preferred embodiments of the susceptor and the device described above. Several possibilites to modifications thereof would be apparent for a man skilled in the art without departing from the basic idea of the invention.

As already mentioned, the invention is also applicable to the growth of a Group 3B-nitride, an alloy of Group 3B-nitrides or an alloy of SiC and one or more Group 3B-nitrides and will lead to the corresponding improved production capacity in the case of the growth of such objects.

The channels may be more than two and the cross-sectional shape thereof may also be different than shown in the figures. This also applies to the cross-section shape of the whole susceptor.

Furthermore, the invention does not exclude the possibility of placing more than one substrate in the same channel.

The substrate may be of a material other than SiC, such as Group 3B-nitrides.

Although it is shown in the figures and indicated in the description that the susceptor is substantially horizontally oriented, it is also possible to give the susceptor any other desired orientation in the room.

The definition "object" in the claims is made for including the epitaxial growth of all types of crystals, such as layers of different thicknesses as well as thick boules.

All definitions concerning the material of course also include inevitable impurities as well as intentional doping.

We claim:

1. A susceptor for a device for epitaxially growing objects of a material on a substrate, said material being selected from the group consisting of SiC, a Group 3B-nitride, and alloys of SiC and a Group 3B-nitride, the susceptor comprising:

at least two channels each adapted to receive at least one substrate for growth of at least one of the objects and each adapted to receive a flow of said material to be fed to the susceptor for said growth of said objects;

means surrounding said susceptor for heating said susceptor;

walls surrounding said at least two channels including a central part between said channels, said walls being made of a material which may be heated by induction by said heating means, said walls being designed so that said heating results in a substantially uniform temperature in substantially the whole susceptor when heated by said heating means;

means over at least one cross-sectional area of said susceptor for creating a higher electrical resistance for induction currents generated by said heating means, said higher electrical resistance creating means comprising a physical division of the susceptor walls and a thin plate of SiC having a higher electrical resistance than the material of the rest of the susceptor walls, said physical division and plates extending between said channels of the susceptor and an outer limitation of the susceptor and between separate wall parts of the susceptor.

2. A susceptor according to claim 1, wherein said physical division restricts loops of the induction currents to parts of the susceptor divided by the physical division thereby preventing the loops of the induction currents from passing into other parts of the susceptor, said physical division also guiding loops of the induction currents through the central part of the susceptor thereby preventing the loops of the induction currents from passing around the central part.

3. A susceptor according to claim 1, wherein said at least two channels are adapted to receive substantially equal portions of said flow of the source material.

4. A susceptor according to claim 3, wherein a thickness of said central part with respect to other parts of the susceptor walls depends upon a relation of the contribution to the heating of the central part of:

radiation heat from the other parts of the susceptor walls; and induction currents generated by said heating means; wherein the larger the ratio 1)/2) is the smaller the thickness of the central part is and conversely.

5. A susceptor according to claim 4, wherein said central part of said susceptor is heated primarily by heat radiating from said susceptor walls upon heating of said susceptor by said heating means, and said central part of said susceptor is thin with respect to said susceptor wall parts.

6. A susceptor according to claim 4, wherein said central part of said susceptor is heated primarily by induction currents generated therein by said heating means upon heating of said susceptor by said heating means, and said central part of said susceptor is thick with respect to said susceptor wall parts.

7. A susceptor according to claim 1, wherein said cross-sectional area extends entirely through said central part of said susceptor between said channels for dividing said susceptor.

8. A susceptor according to claim 1, wherein said means for creating higher electrical resistance further comprises a corrugation of the surfaces along said physical division.

9. A susceptor according to claim 1, wherein each of said channels is adapted to each receive a substrate on which an object of SiC is to be epitaxially grown.

10. A susceptor according to claim 1, wherein the susceptor walls are made of graphite.

11. A susceptor according to claim 10, wherein the surfaces of the susceptor walls are coated by a thin layer of SiC.

12. A susceptor according to claim 1, wherein the walls of the susceptor are made of a material heatable by an Rf-field radiating means.

13. A device for epitaxially growing objects of a material on a substrate, said material being selected from the group consisting of SiC, a Group 3B-nitride, and alloys of SiC and a Group 3B-nitride, said device comprising:

a susceptor adapted to receive said substrate, said susceptor comprising:

at least two channels each adapted to receive at least one substrate for growth of at least one of said objects and each adapted to receive a flow of said material to be fed to the susceptor for said growth of said objects;

walls surrounding said at least two channels;

a central part of the susceptor walls located between said channels;

means surrounding said susceptor for heating said susceptor, including said walls and said central part;

means over at least one cross-sectional area of said susceptor for creating a higher electrical resistance for induction currents generated by said heating means, said higher electrical resistance creating means comprising a physical division of the susceptor walls and a thin plate of SiC, said higher electrical resistance creating means extending between all channels of the susceptor and an outer limitation of the susceptor and between separate wall parts of the susceptor, said higher electrical resistance creating means also restricting flow of loops of the induction currents within parts of the susceptor.

14. A device according to claim 13, wherein said at least two channels of said susceptor are adapted to receive substantially equal portions of said flow of said source material.

15. A device according to claim 14, wherein a thickness of said central part of said susceptor with respect to other parts of the susceptor walls depends upon a relation of the contribution to the heating of said central part of:

radiation heat from the other parts of the susceptor walls; and induction currents generated by said heating means; wherein the larger the ratio 1)/2) is the smaller the thickness of the central part is and conversely.

16. A susceptor according to claim 15, wherein said central part of said susceptor is heated primarily by heat radiating from said susceptor walls upon heating of said susceptor by said heating means, and said central part of said susceptor is thin with respect to said susceptor wall parts.

17. A susceptor according to claim 15, wherein said central part of said susceptor is heated primarily by induction currents generated therein by said heating means upon heating of said susceptor by said heating means, and said central part of said susceptor is thick with respect to said susceptor wall parts.

18. A susceptor according to claim 13, wherein said cross-sectional area extends entirely through said central part of said susceptor between said channels for dividing said susceptor.

19. A susceptor according to claim 13, wherein said means for creating higher electrical resistance further comprises a corrugation of the surfaces along said physical division.

20. A susceptor according to claim 13, wherein each of said channels is adapted to receive a substrate on which an object of SiC is to be epitaxially grown.

21. A susceptor according to claim 13, wherein the susceptor walls are made of graphite.

22. A susceptor according to claim 21, wherein the surfaces of the susceptor walls are coated by a thin layer of SiC.

23. A susceptor according to claims 13, wherein the walls of the susceptor are made of a material heatable by an Rf-field radiating means.

24. A susceptor for a device for epitaxially growing objects of a material on a substrate, said material being selected from the group consisting of SiC, a Group 3B-nitride, and alloys of SiC and a Group 3B-nitride, said susceptor comprising:

at least two channels each adapted to receive at least one substrate for growing at least one of said objects and each adapted to receive a flow of said material to be fed to the susceptor for growing said objects;

a peripheral wall and at least one central wall defining at least two channels;

means surrounding said peripheral wall for heating said susceptor;

means for creating a higher electrical resistance for induction currents generated by said heating means, said higher electrical resistance creating means comprising a physical division of the susceptor walls and a thin plate of SiC, said higher electrical resistance creating means extending between said channels of the susceptor and an outer limitation of the susceptor and between separate wall parts of the susceptor, said higher electrical resistance creating means also restricting flow of loops of the induction currents within parts of the susceptor.

* * * * *